(12) United States Patent
Lee et al.

(10) Patent No.: US 7,897,305 B2
(45) Date of Patent: Mar. 1, 2011

(54) METHOD FOR FORMING PATTERN AND METHOD FOR FABRICATING LCD DEVICE USING THE SAME

(75) Inventors: Hye Sun Lee, Seoul (KR); Jae Young Oh, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 1106 days.

(21) Appl. No.: 11/640,985

(22) Filed: Dec. 19, 2006

(65) Prior Publication Data

US 2007/0148603 A1 Jun. 28, 2007

(30) Foreign Application Priority Data

Dec. 27, 2005 (KR) .................. 10-2005-0130494

(51) Int. Cl.
*G02F 1/1335* (2006.01)
*G03F 7/20* (2006.01)
(52) U.S. Cl. .................. 430/7; 430/323; 430/329
(58) Field of Classification Search .................. None
See application file for complete search history.

(56) References Cited

U.S. PATENT DOCUMENTS 6,127,072 A * 10/2000 Shiba et al. .................. 430/7

FOREIGN PATENT DOCUMENTS

| JP | 02-004264 | 1/1990 |
|---|---|---|
| JP | 02-170521 | 7/1990 |
| JP | 02-288332 | 11/1990 |
| JP | 10-506201 | 6/1998 |
| JP | 11-097824 | 4/1999 |
| JP | 2003-303789 | 10/2003 |
| JP | 2004-029497 | 1/2004 |
| JP | 2004-103872 | 4/2004 |
| JP | 2005-254186 | 9/2005 |
| WO | WO 02/41375 | 5/2002 |

OTHER PUBLICATIONS

Computer-generated translation of JP 2003-303789 (Oct. 2003).*
Horibe et al., "Acrylic-Type Resist Removal Using 532nm Laser Pulse", Journal of the Electrochemical Society, 2006, vol. 153, No. 7, p. G609-G612.

* cited by examiner

*Primary Examiner*—John A. McPherson
(74) *Attorney, Agent, or Firm*—McKenna Long & Aldridge LLP

(57) ABSTRACT

A method for forming a pattern and a method for fabricating an LCD device using the same is disclosed, wherein a photoresist layer is removed from a substrate without using a photoresist stripper, so that the pattern is formed with a low fabrication costs. The method comprising sequentially forming a pattern material layer, a transformed material layer and a photoresist layer on a substrate; patterning the photoresist layer by exposure and development using a mask; selectively etching the transformed material layer and the pattern material layer by using the patterned photoresist layer as a mask; and removing the transformed material layer and the patterned photoresist layer in a lift-off method by applying light.

15 Claims, 10 Drawing Sheets

METHOD FOR FORMING PATTERN AND METHOD FOR FABRICATING LCD DEVICE USING THE SAME

This application claims the benefit of Korean Patent Application No. P2005-130494, filed on Dec. 27, 2005, which is hereby incorporated by reference for all purposes as if fully set forth herein.

BACKGROUND OF THE INVENTION

1. Field of the Invention

The present invention relates to a method for fabricating a liquid crystal display (LCD) device, and more particularly, to a method for forming a pattern and a method for fabricating an LCD device using the same.

2. Discussion of the Related Art

Ultra thin flat panel LCD devices, of a thickness of several centimeters, have been used in notebook computers, monitors, spacecraft and airplanes, for example, because of their low power consumption and portability.

The LCD device may include lower and upper substrates facing each other with a predetermined interval therebetween, and a liquid crystal layer formed between the lower and upper substrates and sealed by a sealant.

The lower substrate may include gate and data lines formed perpendicularly to define a pixel region, a thin film transistor as a switching element formed adjacent to a crossing of the gate and data lines, and a pixel electrode connected to the thin film transistor and formed in the pixel region. The upper substrate may include a light-shielding layer to prevent light leakage in areas except the pixel region, a color filter layer of red (R), green (G), and blue (B) to represent colors in the area corresponding to the pixel region, and a common electrode formed on the color filter layer.

The LCD device includes the above various elements which are fabricated by repeated steps. The various elements may vary in shape by photolithography.

Hereinafter, a method for forming a pattern by related art photolithography will be explained with reference to the accompanying drawings.

FIGS. 1A to 1E are cross sectional views illustrating a method for forming a pattern by related art photolithography.

As shown in FIG. 1A, a pattern material layer 20 and a photoresist layer 30 are sequentially formed on a substrate 10.

As shown in FIG. 1B, after a mask 35 having a predetermined pattern is positioned above the photoresist layer 30, light is applied onto the photoresist layer 30 through the mask 35.

Referring to FIG. 1C, the photoresist layer 30 is selectively removed by development, whereby the photoresist layer 30 is patterned. In this case, the photoresist layer 30 may be formed of a positive type or a negative type photoresist. For the positive type photoresist, the portion irradiated with light is removed. For the negative type photoresist, the portion not irradiated with light is removed.

As shown in FIG. 1D, the pattern material layer 20 is selectively etched by using the patterned photoresist layer 30a as a mask. In this case, the process of removing the patterned photoresist layer 30 uses a photoresist stripper.

FIGS. 2A and 2B illustrate the process of removing the photoresist layer 30a by using a related art photoresist stripper.

As shown in FIG. 2A, a spacer 50 is positioned on the bottom of a container, and the container is filled with the photoresist stripper 40. Then, the substrate having the photoresist layer 30a is dipped into the container filled with the photoresist stripper 40, whereby the photoresist layer 30a is removed from the substrate as illustrated in FIG. 1E.

As shown in FIG. 2B, the photoresist stripper 40 is sprayed onto the substrate through a nozzle 45, thereby removing the photoresist layer 30a from the substrate. However, the photoresist stripper is expensive, and results in an additional cost for the disposal of photoresist stripper. The cost for the disposal of photoresist stripper corresponds to about 20% of the entire fabrication cost. Furthermore, environmental contamination may result from the disposal of photoresist stripper.

SUMMARY OF THE INVENTION

Accordingly, the present invention is directed to a method for forming a pattern and a method for fabricating an LCD device using the same, which substantially obviates one or more problems due to limitations and disadvantages of the related art.

An advantage of the present invention is to provide a method for forming a pattern and a method for fabricating an LCD device using the same, wherein a photoresist layer is removed from a substrate without using a photoresist stripper, so that the pattern is formed with a reduced fabrication cost.

Additional features and advantages of the present invention will be set forth in the description which follows, and in part will be apparent from the description, or may be learned from practice of the invention. These and other advantages of the invention will be realized and attained by the structure particularly pointed out in the written description and claims hereof as well as the appended drawings.

To achieve these and other advantages and in accordance with the purpose of the invention as embodied and broadly described herein, a method for forming a pattern comprises sequentially forming a pattern material layer, a transformed material layer and a photoresist layer on a substrate; patterning the photoresist layer by exposure and development using a mask; selectively etching the transformed material layer and the pattern material layer by using the patterned photoresist layer as a mask; and removing the transformed material layer and the patterned photoresist layer in a lift-off method by applying light.

In another aspect of the present invention, a method for fabricating an LCD device comprises forming a light-shielding layer on a first substrate; forming a color filter layer on the first substrate including the light-shielding layer; preparing a second substrate; and forming a liquid crystal layer between the first and second substrates, wherein at least any one of the steps of forming the light-shielding layer on the first substrate, and forming the color filter layer on the first substrate is performed by a lift-off pattern-formation method.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1A:
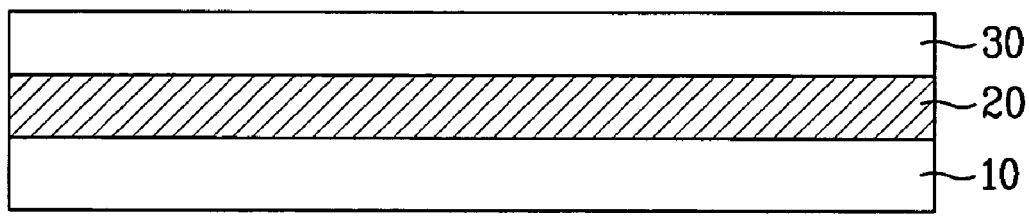
FIGS. 1A through and including 1E are cross sectional views illustrating a method for forming a pattern by related art photolithography.
Figure 1B:
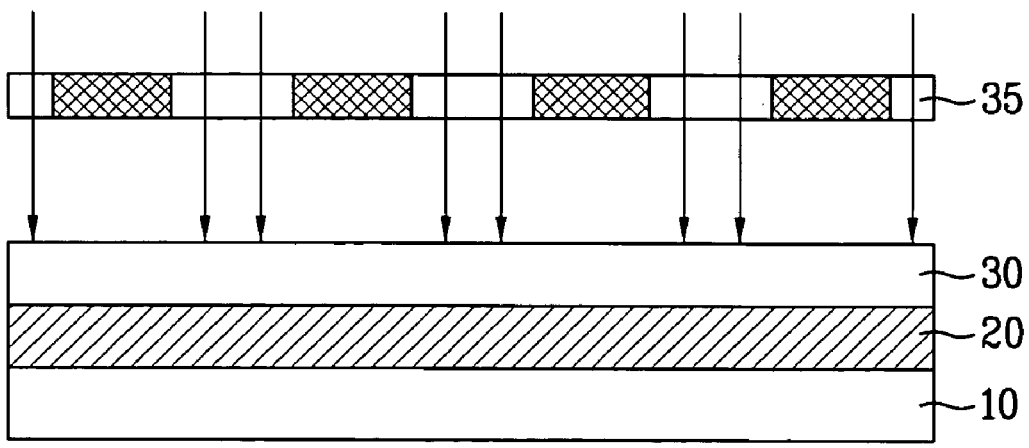
Figure 1C:
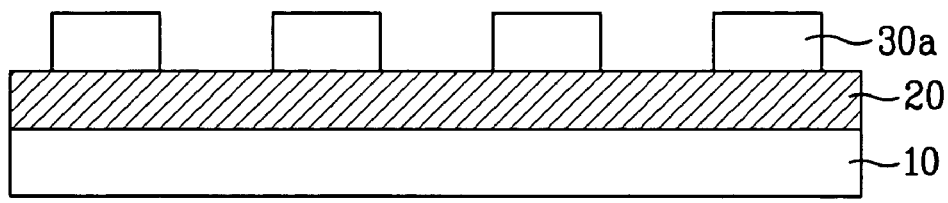
Figure 1D:
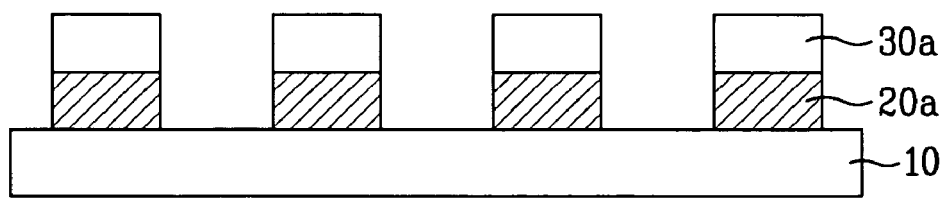
Figure 1E:
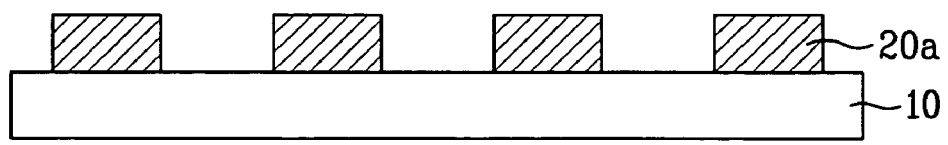
Figure 2A:
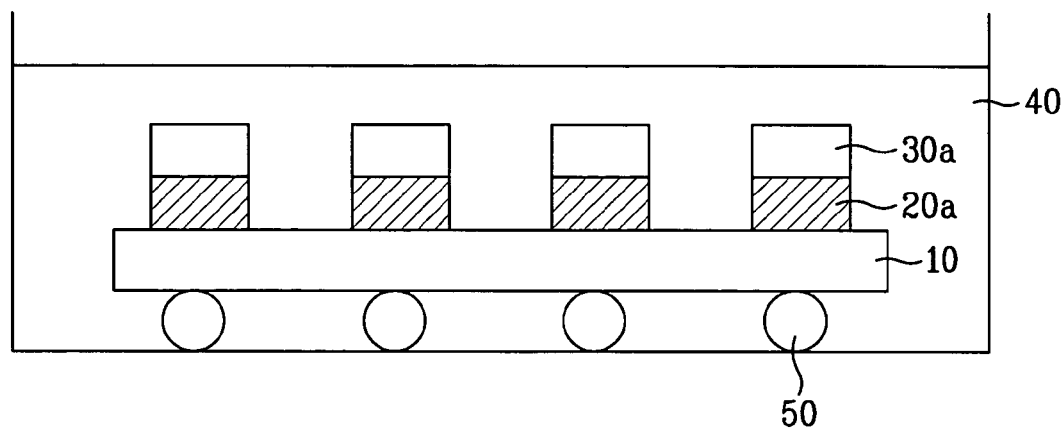
FIGS. 2A and 2B are cross sectional views illustrating a method for removing a photoresist layer from a substrate by using a related art photoresist stripper.
Figure 2B:
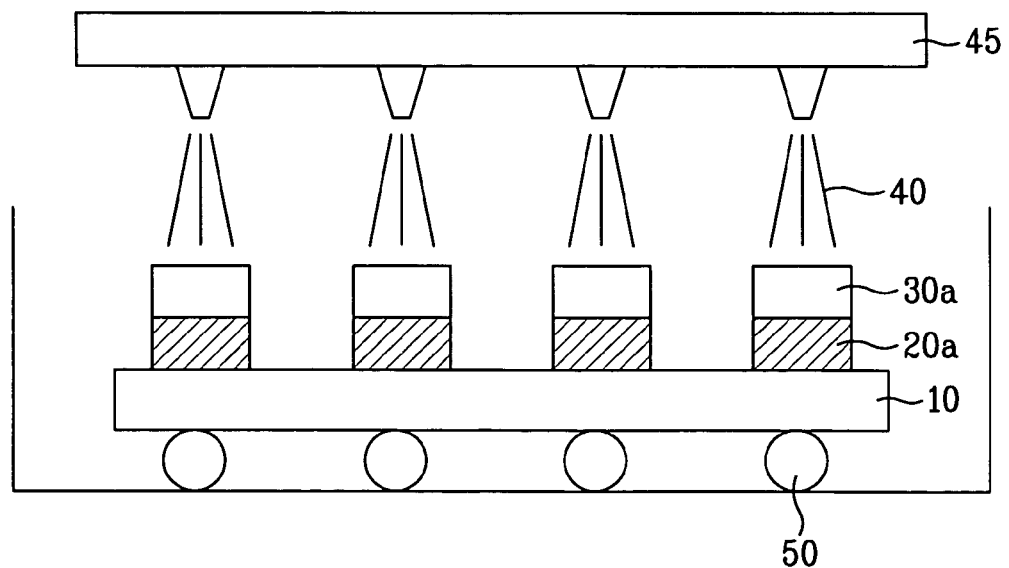
Figure 3A:
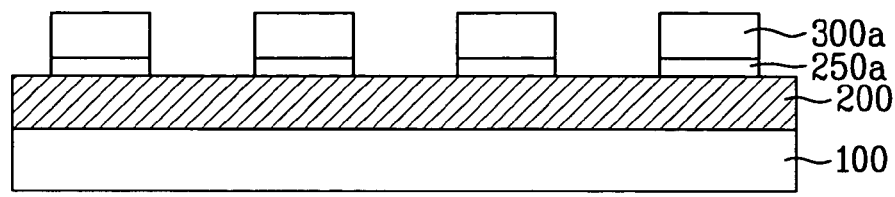
FIGS. 3A through and including 3E are cross sectional views illustrating a method for forming a pattern according to an embodiment of the present invention.

As shown in FIG. 3A, a pattern material layer 200 is formed on a substrate 100. Then, a transformed material layer 250a and a photoresist layer 300a are sequentially formed on the pattern material layer 200, wherein each of the transformed material layer 250a and the photoresist layer 300a has a predetermined pattern.

A method for forming the pattern material layer 250a and the photoresist layer 300a will be explained with reference to FIGS. 4A to 4C.

Figure 4A:
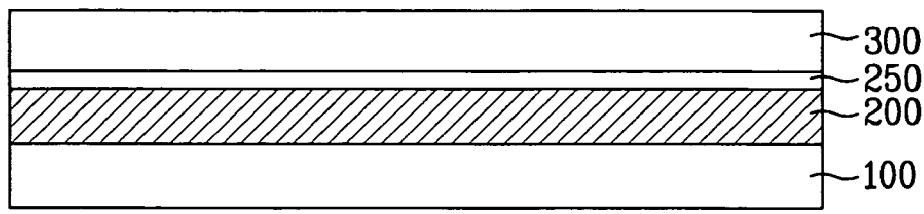
FIGS. 4A through and including 4C are cross sectional views illustrating a process for forming a transformed material layer and a photoresist layer on a pattern material layer, wherein each of the transformed material layer and the photoresist layer has a predetermined pattern.

As shown in FIG. 4A, a pattern material layer 200, a transformed material layer 250 and a photoresist layer 300 are sequentially formed on a substrate 100.

Figure 4B:
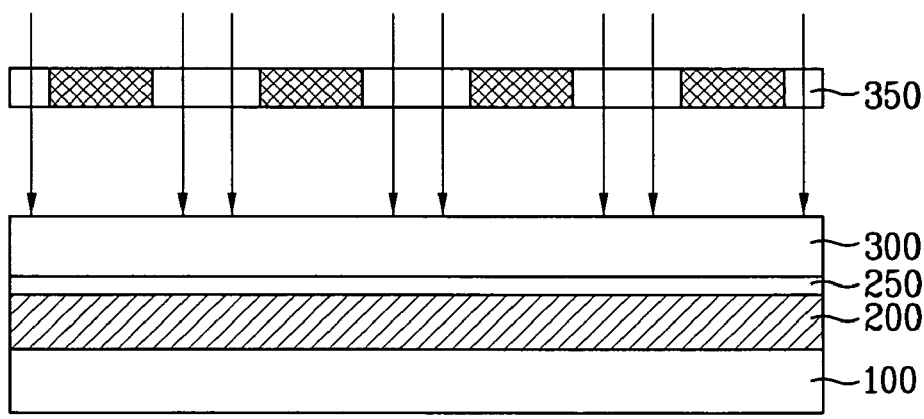

Referring to FIG. 4B, a mask 350 having a predetermined pattern is positioned substantially above the photoresist layer 300. Light is applied onto the photoresist layer 300 through the mask 350.

Figure 4C:
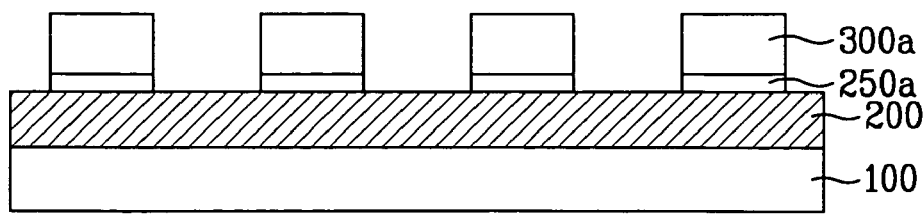

As shown in FIG. 4C, the photoresist layer 300a is patterned by development, whereby the photoresist layer 300a is formed substantially in the shape of the predetermined pattern of the mask 350. Then, the transformed material layer 250 is removed using the patterned photoresist layer 300a as a mask, so that the transformed material layer 250a is formed in the predetermined pattern.

On the pattern material layer 200, there is formed the transformed material layer 250a of the predetermined pattern and the photoresist layer 300a of the predetermined pattern.

Figure 3B:
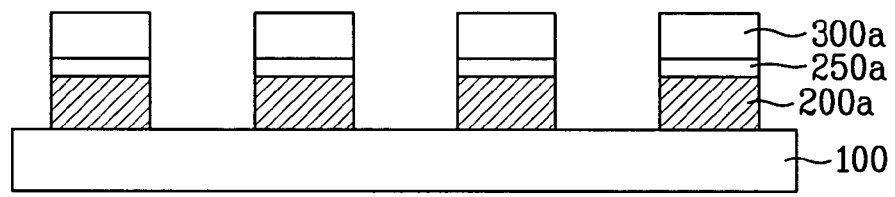

Returning to FIG. 3B, the pattern material layer 200a is etched using the transformed material layer 250a and the photoresist layer 300a as a mask. The pattern material layer 200a may be etched by a dry-etching method using plasma, or a wet-etching method using an etchant.

Figure 3C:
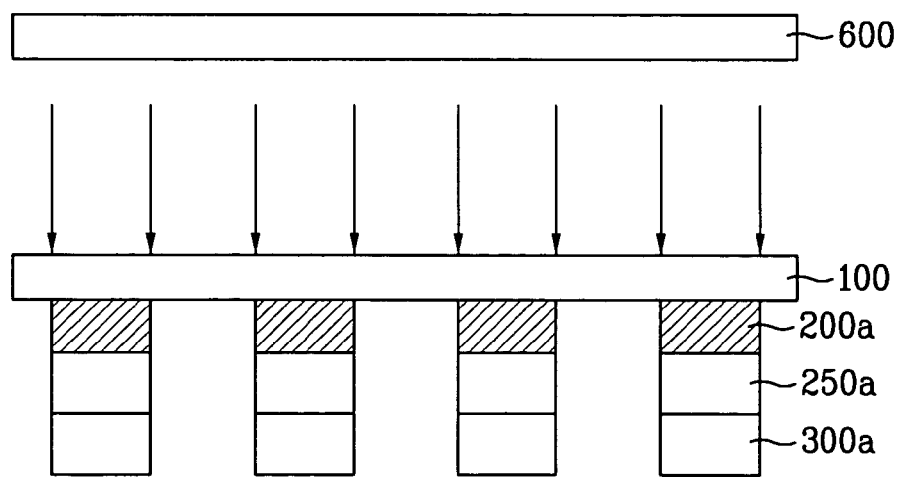

In FIG. 3C, the substrate 100 including the photoresist layer 300a and the transformed material layer 250a is inverted. Then, high energy light, for example, ultraviolet rays, emitted from a light-irradiation apparatus 600 is applied to the rear surface of the substrate 100.

As high energy light is applied to the transformed material layer 250a through the substrate 100 and the pattern material layer 200a, the transformed material layer 250a expanding in volume, as shown in FIG. 3C.

Figure 5A:
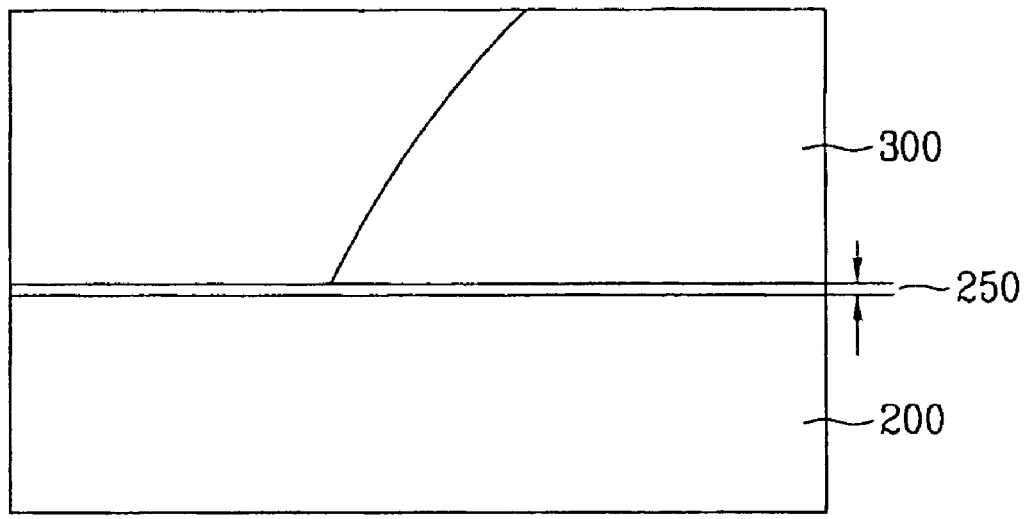
FIGS. 5A and 5B are photographs showing a transformed material layer which expands in volume when high energy light is applied thereto.
Figure 5B:
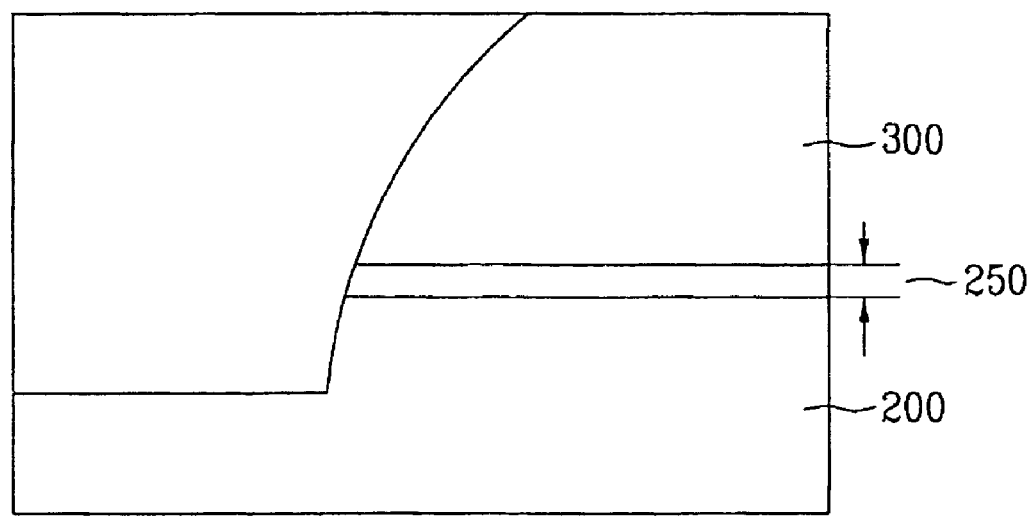

FIGS. 5A and 5B are photographs showing the transformed material layer 250 which expands in volume when high energy light is applied thereto.

FIG. 5A is a photograph showing the transformed material layer 250 before high energy light is applied thereto, and FIG. 5B is a photograph showing the transformed material layer 250 after high energy light is applied thereto.

As shown in FIGS. 5A and 5B, as high energy light is applied to the transformed material layer 250, the transformed material layer 250 expands in volume.

Depending on the kind of material used for the transformed material layer 250, the transformed material layer 250 may decompose.

Figure 3D:
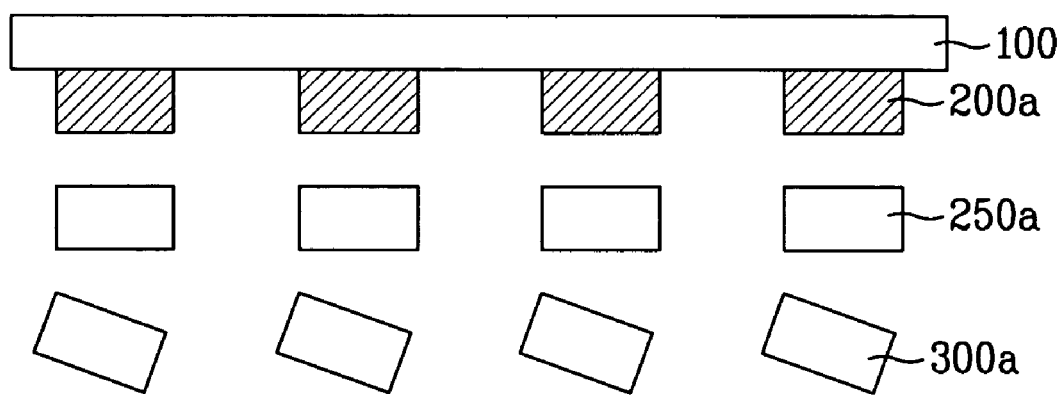
Figure 3E:
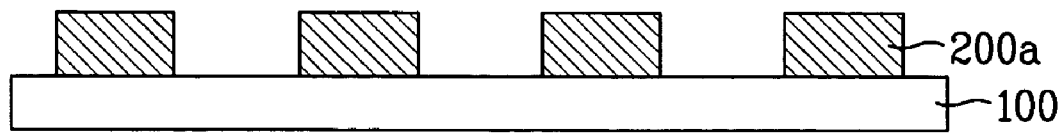

Because the transformed material layer 250a has a weak adhesion owing to expansion, the transformed material layer 250a is separated from the pattern material layer 200a of the predetermined pattern, and may also be separated from the photoresist layer 300a, as shown in FIG. 3D, which is referred to as a lift-off method.

By using an air knife, air is applied to the photoresist layer 300a and the transformed material layer 250a, so that it is possible to remove the transformed material layer 250a from the pattern material layer 200a with ease. Preferably, the air is provided at a pressure of about 5~25 [kg·f/m$^2$].

For example, when the light-irradiation apparatus 600 applies high energy light, for example, ultraviolet rays, to the substrate, the light-irradiation apparatus 600 may be positioned below the substrate 100 as well as above the substrate 100.

Figure 6:
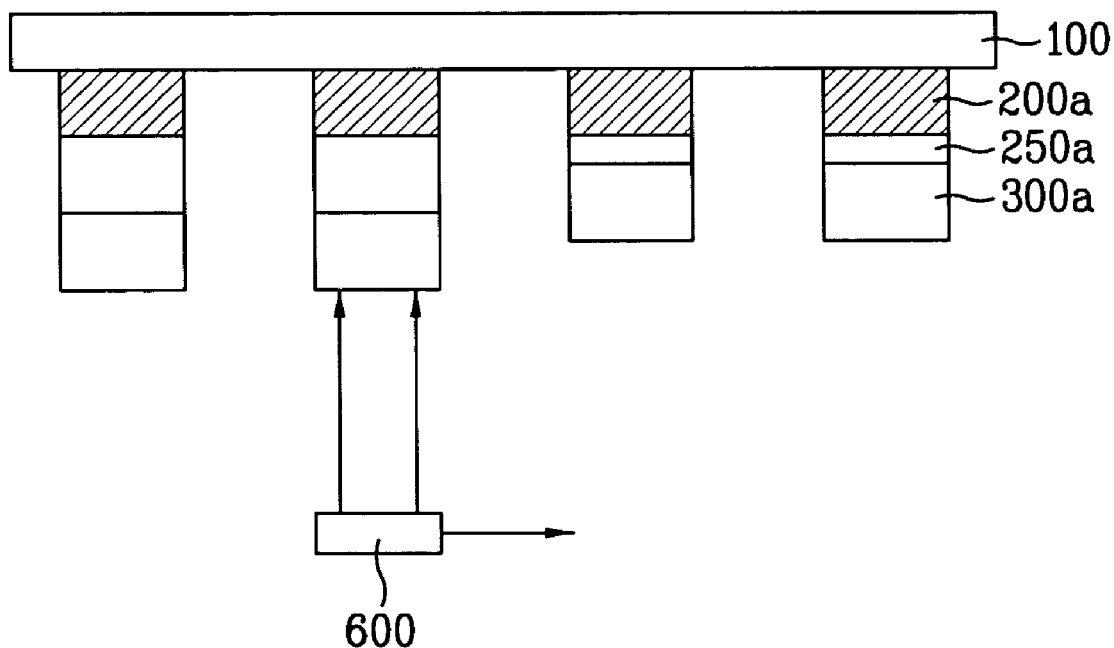
FIG. 6 is a cross sectional view illustrating a process of applying light to a substrate when positioning a light-irradiation apparatus below the substrate.

As shown in FIG. 6, if the light-irradiation apparatus 600 is positioned below the substrate 100, the transformed material layer 250a having expanded may drop on the light-irridiation apparatus 600. Accordingly, the light-irradiation apparatus 600 is moved continuously when emitting light.

When the transformed material layer 250a is positioned between the pattern material layer 200 and the photoresist layer 300, the transformed material layer 250a may be formed of acrylic resin. The acrylic resin may be formed by coating or deposition. Also, the acrylic resin expands when light is applied thereto, and the acrylic resin does not react to plasma and etchant. Thus, acrylic resin is appropriate for the transformed material layer 250a.

In addition to acrylic resin, the transformed material layer 250 may be formed of any material having the above-mentioned properties which are necessary for the transformed material layer. For example, the transformed material layer may be formed of Si-based nano powder, cellulose molecule, or calcium chloride. The Si-based nano powder has good adhesion, expands in volume under predetermined temperature conditions, and does not react to plasma and etchant. Also, the cellulose molecule expands in the water, so that the cellulose molecule has a weak bonding strength. The calcium chloride exothermically reacts with water whereby the calcium chloride melts.

FIGS. 7A to 7D are cross sectional views illustrating a method for fabricating a substrate according to an embodiment of the present invention.

Figure 7A:
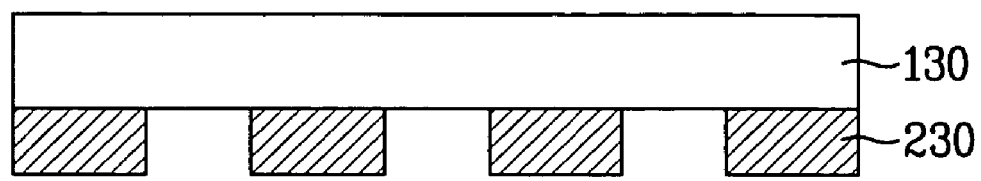
FIGS. 7A through and including 7D are cross sectional views illustrating a method for fabricating a substrate of an LCD device according to an embodiment of the present invention.
Figure 7B:
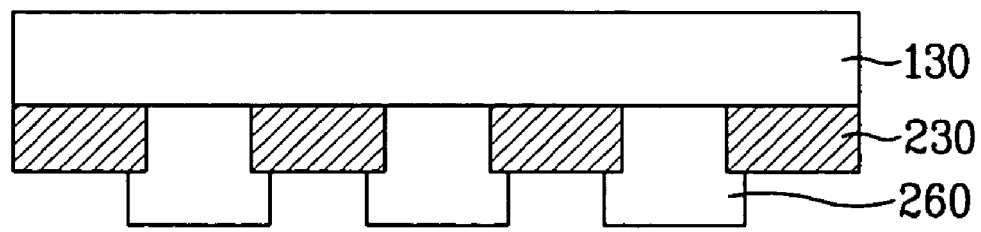

First, as shown in FIG. 7A, a light-shielding layer 230 is formed on a first substrate 130. Then, as shown in FIG. 7B, a color filter layer 260 is formed on the first substrate 130 including the light-shielding layer 230. At this time, at least any one of the processes of forming the light-shielding layer (FIG. 7A) and forming the color filter layer (FIG. 7B) is performed by the above-mentioned pattern-forming method according to an embodiment of the present invention.

Figure 7C:
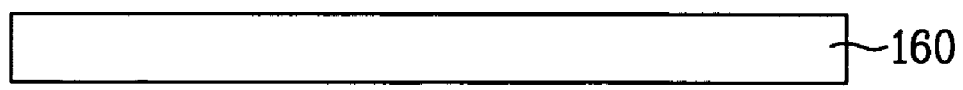

After that, as shown in FIG. 7C, a second substrate 160 is prepared. The process of preparing the second substrate is performed by the above-mentioned pattern-forming method according to an embodiment of the present invention. Although not shown, formation of the second substrate 160 includes steps of forming gate and data lines substantially crossing each other to define a pixel region; forming a thin film transistor adjacent to a crossing of the gate and data lines; forming a passivation layer on an entire surface including the thin film transistor; and forming a pixel electrode on the passivation layer, the pixel electrode connected with a drain electrode of the thin film transistor.

Figure 7D:
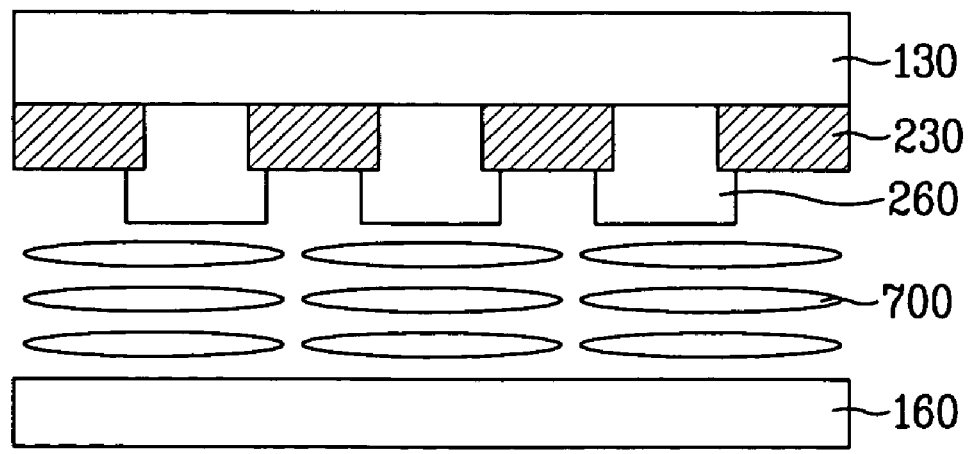

As shown in FIG. 7D, a liquid crystal layer 700 is formed between the first and second substrates 130 and 160. The liquid crystal layer 700 may be formed by a liquid crystal dispensing method. In the liquid crystal dispensing method, a sealant having no inlet is formed on any one of the first and second substrates 130 and 160, and liquid crystal is dispensed onto the substrate having the sealant, and then the two substrates 130 and 160 are bonded to each other.

The liquid crystal layer 700 may also be formed by a liquid crystal injection method. In the liquid crystal injection method, a sealant having an inlet is formed on any one of the first and second substrates 130 and 160, and the two substrates are bonded to each other, and then liquid crystal is injected into a space between the first and second substrates 130 and 160 through the inlet by capillary action and pressure difference.

As mentioned above, the method for forming the pattern according to the present invention and the method for fabricating the LCD device using the same have the following advantages.

In the method for forming the pattern according to the present invention, the transformed material layer is formed between the pattern material layer and the photoresist layer. Thus, the photoresist layer is physically removed from the substrate because of the expansion and weak adhesion of the transformed material layer. Thus, it is possible to remove the photoresist layer from the substrate without using an expensive photoresist stripper, thereby decreasing the fabrication costs.

Also, the method for forming the pattern according to the present invention can save on the disposal cost for the photoresist stripper, and also can prevent potential environmental contamination.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for forming a pattern comprising:
   sequentially forming a pattern material layer, a transformed material layer and a photoresist layer on a substrate;
   patterning the photoresist layer by exposure and development using a mask;
   selectively etching the transformed material layer and the pattern material layer by using the patterned photoresist layer as a mask; and
   removing the transformed material layer and the patterned photoresist layer in a lift-off method by applying light, wherein the substrate, from which the pattern material layer is selectively etched, is inverted before applying the light thereto, and then a light-irradiation apparatus is positioned above the substrate to apply the light to a rear surface of the substrate.

2. The method of claim 1, wherein the process of removing the transformed material layer and the patterned photoresist layer in a lift-off method by applying light is performed by applying high energy light to the rear surface of the substrate from which the pattern material layer is selectively etched, to thereby separate the transformed material layer from the pattern material layer because of the expansion of the transformed material layer.

3. The method of claim 2, wherein high energy light is an ultraviolet ray.

4. The method of claim 1, wherein the process of removing the transformed material layer and the patterned photoresist layer in a lift-off method by applying light is performed by applying high energy light to the rear surface of the substrate from which the pattern material layer is selectively etched, to thereby separate the transformed material layer from the pattern material layer because of the decomposition of the transformed material layer.

5. The method of claim 1, wherein the process of removing the transformed material layer and the patterned photoresist layer in a lift-off method by applying light includes applying air to the photoresist layer and the transformed material layer using an air knife.

6. The method of claim 1, wherein the transformed material layer is formed of acrylic resin.

7. A method for fabricating an LCD device comprising:
   forming a light-shielding layer on a first substrate;
   forming a color filter layer on the first substrate including the light-shielding layer;
   preparing a second substrate; and
   forming a liquid crystal layer between the first and second substrates,
   wherein at least any one of the steps of forming the light-shielding layer on the first substrate, and forming the color filter layer on the first substrate is performed by a lift-off pattern-formation method,
   wherein the step of forming the light-shielding layer or forming the color filter layer on the first substrate includes:
   sequentially forming a pattern material layer to form the light-shieling layer or the color filter layer, a transformed material layer and a photoresist layer on a substrate;
   patterning the photoresist layer;
   selectively etching the transformed material layer and the pattern material layer by using the patterned photoresist layer as a mask; and
   removing the transformed material layer and the patterned photoresist layer in a lift-off method by applying light, and
   wherein the substrate, from which the pattern material layer is selectively etched, is inverted before applying the light thereto, and then a light-irradiation apparatus is positioned above the substrate to apply the light to a rear surface of the substrate.

8. The method of claim 7, wherein the process of removing the transformed material layer and the patterned photoresist layer in a lift-off method by applying light is performed by applying high energy light to the rear surface of the substrate from which the pattern material layer is selectively etched, to thereby separate the transformed material layer from the pattern material layer because of the expansion of the transformed material layer.

9. The method of claim 7, wherein the process of preparing the second substrate includes:
   forming gate and data lines substantially crossing each other on the second substrate to define a unit pixel region;
   forming a thin film transistor adjacent to a crossing portion of the gate and data lines;
   forming a passivation layer on the second substrate including the thin film transistor; and
   forming a pixel electrode on the passivation layer, the pixel electrode connected with a drain electrode of the thin film transistor.

10. The method of claim 9, wherein at least any one of the steps of forming gate and data lines, forming a thin film transistor, and forming a pixel electrode is performed by a lift-off pattern-formation method.

11. The method of claim 10, wherein at least any one of steps of forming gate and data lines, forming a thin film transistor, and forming a pixel electrode on the second substrate includes:
   sequentially forming a pattern material layer to form the gate and data lines, the thin film transistor, or the pixel electrode, a transformed material layer and a photoresist layer on a substrate;
   patterning the photoresist layer;
   selectively etching the transformed material layer and the pattern material layer by using the patterned photoresist layer as a mask; and
   removing the transformed material layer and the patterned photoresist layer in a lift-off method by applying light.

12. The method of claim 11, wherein the process of removing the transformed material layer and the patterned photoresist layer in a lift-off method by applying light is performed by applying high energy light to the rear surface of the substrate from which the pattern material layer is selectively etched, to thereby separate the transformed material layer from the pattern material layer because of the expansion of the transformed material layer.

13. The method of claim 7, wherein the process of forming the liquid crystal layer between the first and second substrates includes:
   forming a sealant having no inlet on any one of the first and second substrates; and
   bonding the two substrates to each other after dispensing liquid crystal onto the substrate having the sealant.

14. The method of claim 7, wherein the process of forming the liquid crystal layer between the first and second substrates includes:
   forming a sealant having an inlet in any one of the first and second substrates; and
   injecting liquid crystal into a space between the first and second substrate through the inlet after bonding the two substrates to each other.

15. A method for forming a pattern comprising:
   sequentially forming a pattern material layer, a transformed material layer and a photoresist layer on a substrate;
   patterning the photoresist layer by exposure and development using a mask;
   selectively etching the transformed material layer and the pattern material layer by using the patterned photoresist layer and a mask; and
   removing the transformed material layer and the patterned photoresist layer in a lift-off method by applying light,
   wherein the process of removing the transformed material layer and the patterned photoresist layer in a lift-off method by applying light is performed by applying high energy light to a rear surface of the substrate from which the pattern material layer is selectively etched, to thereby separate the transformed material layer from the pattern material layer because of the expansion of the transformed material layer,
   wherein the process of applying high energy light to the substrate uses a light source positioned below the substrate, and is continuously moved when emitting light.

* * * * *